(12) United States Patent
You

(10) Patent No.: US 7,828,894 B2
(45) Date of Patent: Nov. 9, 2010

(54) METHOD FOR CRYSTALLIZING SILICON USING A RAMP SHAPED LASER BEAM

(75) Inventor: JaeSung You, Seoul (KR)

(73) Assignee: LG Display Co., Ltd., Seoul (KR)

( * ) Notice: Subject to any disclaimer, the term of this patent is extended or adjusted under 35 U.S.C. 154(b) by 665 days.

(21) Appl. No.: 11/263,838

(22) Filed: Nov. 2, 2005

(65) Prior Publication Data

US 2006/0094213 A1    May 4, 2006

(30) Foreign Application Priority Data

Nov. 4, 2004    (KR) .................... 10-2004-0089449

(51) Int. Cl.
*C30B 1/02* (2006.01)
(52) U.S. Cl. .............. 117/5; 117/7; 117/8; 117/9; 117/48; 117/933
(58) Field of Classification Search .................. 117/5, 117/7, 8, 9, 48, 933
See application file for complete search history.

(56) References Cited

U.S. PATENT DOCUMENTS 6,372,039 B1 *   4/2002   Okumura et al. ............. 117/8
7,318,866 B2 *   1/2008   Im .............................. 117/202

* cited by examiner

*Primary Examiner*—Robert M Kunemund
(74) *Attorney, Agent, or Firm*—McKenna Long & Aldridge

(57) ABSTRACT

A crystallization method, includes: forming an amorphous silicon layer on a substrate; forming a first crystallization region by irradiating the amorphous silicon layer with a laser beam having a ramp shaped cross sectional profile that decreases in a scanning direction; and performing a second crystallization by moving a predetermined length in a scanning direction so as to be partially overlapped with the first crystallization region formed by the first crystallization.

8 Claims, 6 Drawing Sheets

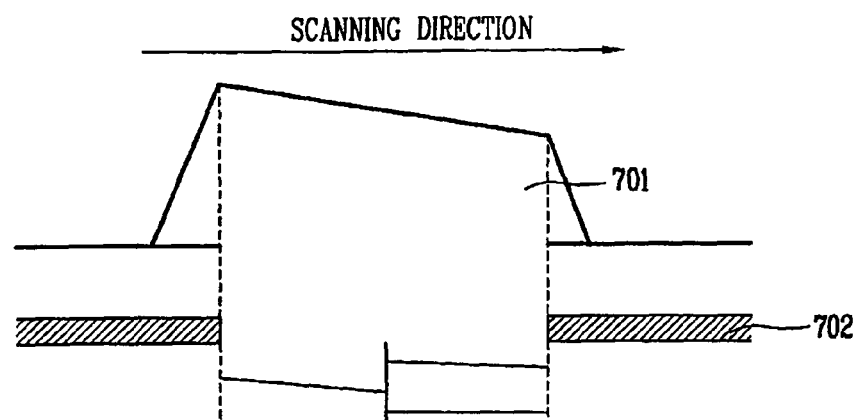
FIG. 7A
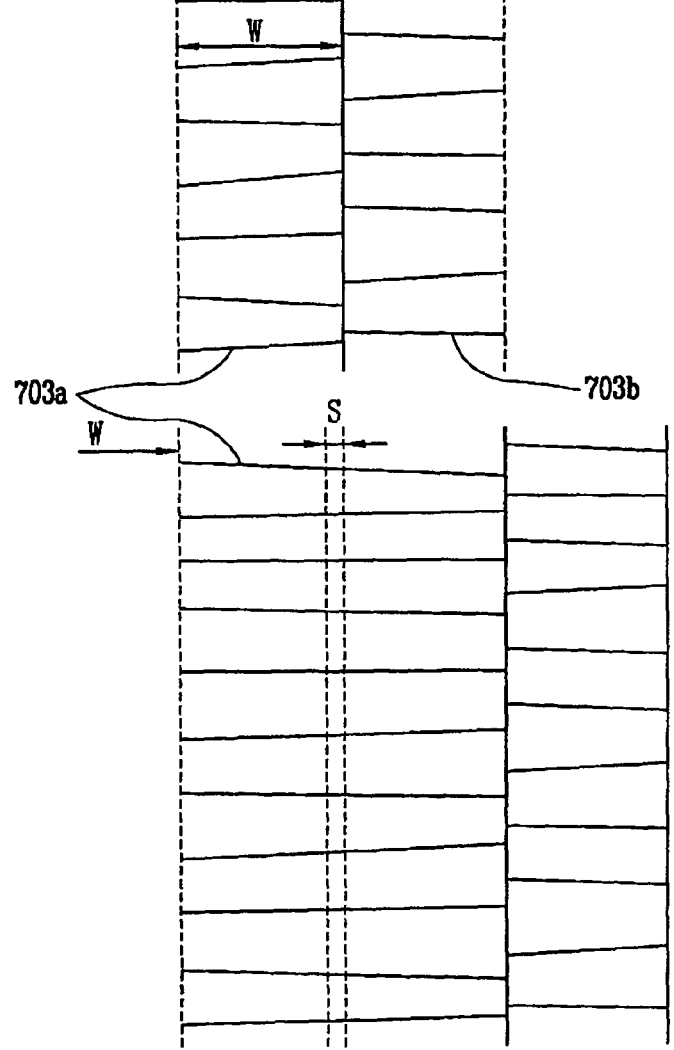
FIG. 7B
FIG. 7C

METHOD FOR CRYSTALLIZING SILICON USING A RAMP SHAPED LASER BEAM

This application claims the benefit of Korean Patent Application No. 10-2004-0089449, filed Nov. 4, 2004, which is hereby incorporated by reference for all purposes as if fully set forth herein.

BACKGROUND OF THE INVENTION

1. Field of the Invention

The present invention relates to a method for crystallizing polysilicon, and more particularly, to a method for crystallizing polysilicon using a laser with a ramp shaped cross sectional profile.

2. Discussion of the Related Art

Liquid crystal display devices are widely used because they are lightweight, thin, short, and small and have superior portability. As the demand for video display devices requiring high speed operation characteristics increases, the effort to develop video display devices capable of a high speed operation is advancing.

The development of high speed liquid crystal video display devices is actively in progress. A lot of effort is focused on the enhancement of the operation speed of switching devices that determine the operation characteristics of a liquid crystal display device.

A thin film transistor (TFT) is commonly used as the switching device in a liquid crystal display device. The operation speed of the TFT largely depends upon the performance of a silicon thin film constituting the channel.

Typically, amorphous silicon is used as a channel layer of the TFT. Amorphous silicon has a poor electric mobility. Therefore, the study of applying polysilicon having a high electric mobility of several tens to several hundreds of times higher than conventional amorphous silicon is underway.

Polysilicon has an electric mobility of up to 100 cm2/Vsec, and thus has a far superior operation speed versus amorphous silicon having an electric mobility of 0.1 to 0.2 cm2/Vsec.

One common method for forming polysilicon includes crystallizing an amorphous thin film. An example of crystallizing amorphous silicon includes heating amorphous silicon in a furnace. However, this method is problematic in that the crystallization speed is low. Further, a glass substrate may be used as a substrate of a liquid crystal display device, and because the glass substrate is deformed at a temperature higher than 600° C., the heating method in which crystallization is carried out at a temperature higher than 600° C. will not work to crystallize amorphous silicon utilizing glass as a substrate.

To overcome this problem, a laser crystallization method has been devised. The laser crystallization method induces crystallization by instantaneously melting an amorphous silicon layer by irradiating a high intensity laser on a small region and then cooling it.

The laser crystallization method allows crystallization at a temperature lower than a glass transition temperature. The crystallization of amorphous silicon using a laser crystallization method will be described briefly with reference to FIG. 1.

FIG. 1 is a graph showing the relation between laser energy density irradiated on amorphous silicon and the resulting size of the crystallized particles. As shown in FIG. 1, the crystallization of amorphous silicon may be divided into a first region, a second region, and a third region depending upon the intensity of the incident laser energy.

The first region is a partial melting region, where the intensity of the laser energy irradiated onto the amorphous silicon layer melts only the surface of the amorphous silicon layer. After irradiation, the surface of the amorphous silicon layer is partially melted in the first region, whereby small crystal grains form on the surface of the amorphous silicon layer after a solidification process.

The second region is a near-to-complete melting region, where the intensity of the laser energy, being higher than that of the first region, almost completely melts the amorphous silicon. After almost complete melting, the remaining nuclei are used as seeds for a crystal growth, thereby forming crystal particles with an increased crystal growth as compared to the first region. However, the crystal particles formed in the second region are not uniform. The second region is also narrower than the first region.

The third region is the complete melting region, whereby laser energy with an increased intensity, as compared to that of the second region, is irradiated to completely melt the amorphous silicon layer. After the complete melting of the amorphous silicon layer, a solidification process is carried out through a cooling procedure, so as to allow a homogenous nucleation, thereby forming a crystal silicon layer formed of fine and uniform crystal particles.

In this method of fabricating polysilicon, the number of laser beam irradiations and the degree of overlap are controlled so as to form uniform large and rough crystal particles by using the energy density of the second region.

A crystallization method in which the excimer laser is commonly used as a light source and the intensity of the laser energy is within the second region of FIG. 1 is referred to as excimer laser annealing (ELA).

In the crystallization processing using the ELA method, because a strong laser energy is irradiated directly on the surface of an amorphous silicon film but a relatively weak laser energy is irradiated on a lower part of the amorphous silicon film, the surface completely melts, but the lower part does not completely melt. Therefore, the silicon that does not melt acts as seeds and crystallization starts around the seeds; thus crystals of large and small size are formed.

On the other hand, if the intensity of a laser energy irradiated on the silicon layer reaches the third region, the amorphous silicon in an irradiated region is all melted, and no nucleus around which crystals can grow exists.

Thereafter, nuclei are randomly formed in the amorphous silicon as it cools, and crystals grow around the nuclei. As a result, the grains formed are very small in shape.

However, if crystallization is performed by using a laser in the complete melting region and utilizing a laser mask having a given size, the amorphous silicon layer that is not melted act as seeds, and crystallization grows laterally. When a laser irradiates an amorphous silicon layer by using a laser mask with an opening, the amorphous silicon is cooled by both lateral sides, i.e., the amorphous silicon layer which is not irradiated by the laser immediately after the laser irradiation finishes because the solid amorphous silicon layer at the sides has a higher thermal conductivity than the insulating layer under the amorphous silicon layer.

Therefore, the amorphous silicon melted by the laser energy undergoes a grain growth using the unmelted amorphous silicon at its sides as nuclei. At this time, grains are crystallized in a regular pattern in a lateral direction. As a result, the crystalline material that grows laterally produces one grain boundary in the center to form a large grain.

The above crystallization method is called as a sequential lateral solidification (SLS) because the grain grows laterally. The size of a laterally grown grain is usually 1-2 μm.

While the size of a grain resulting from a general laser annealing is several tens of mm, the size of a grain obtained through the above SLS crystallization method is several μm. Thus, polycrystalline silicon having the above grain size is applicable to a switching device where a large electric mobility can be realized.

When taking the maximum size of a grain that can grow by the sequential lateral solidification into account, if the sequential lateral solidification is performed at both lateral sides, it is possible to obtain a crystalline body in which a grain has only one grain boundary, and the crystal size is larger.

FIG. 2 shows a SLS crystallized silicon which is crystallized laterally at lateral sides and meets at one grain boundary formed in the center.

However, because of the development of integral type liquid crystal display devices which are on one substrate with driving elements as well as pixel elements of the liquid crystal display device, a demand for the fabrication of polysilicon having faster operation characteristics results.

SUMMARY OF THE INVENTION

Accordingly, the present invention is directed to a method for crystallizing silicon using a ramp shaped laser beam that substantially obviates one or more of the problems due to limitations and disadvantages of the related art.

An advantage of the present invention is to increase the size of polycrystalline silicon to be grown while performing crystallization by a sequential lateral solidification in fabricating a liquid crystal display device used for high speed operation. Particularly, an advantage of the present invention is to improve a crystallization speed per unit time by performing a sequential lateral solidification by using a ramp type laser beam with a ramp upper end profile of the laser beam used for the sequential lateral solidification.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a crystallization method, includes: forming an amorphous silicon layer on a substrate; forming a first crystallization region by irradiating the amorphous silicon layer with a laser beam having a ramp shaped cross sectional profile that decreases in a scanning direction; and performing a second crystallization by moving a predetermined length in a scanning direction so as to be partially overlapped with the first crystallization region formed by the first crystallization.

In another aspect of the present invention, a method of fabricating a liquid crystal display device, includes: forming an amorphous silicon layer on a substrate; a first crystallization step of forming an asymmetrical first crystallization region by irradiating the amorphous silicon layer with a laser beam having a ramp shaped cross sectional profile that decreases in a scanning direction; and a second crystallization step of irradiating a laser beam by moving the laser beam in the scanning direction so as to overlap a portion of the first crystallization region; and crystallizing the entire amorphous silicon layer by repeating the first crystallization step and the second crystallization step.

It is to be understood that both the foregoing general description and the following detailed description are exemplary and explanatory and are intended to provide further explanation of the invention as claimed.

BRIEF DESCRIPTION OF THE DRAWINGS

Accompanying drawings, which are included to provide a further understanding of the invention and are incorporated in and constitute a part of this specification, illustrate embodiments of the invention and together with the description serve to explain the principles of the invention.

In the drawings:

FIG. 7 is a pattern diagram showing a laser crystallization method according to the present invention.

DETAILED DESCRIPTION OF THE ILLUSTRATED EMBODIMENTS

Reference will now be made in detail to an embodiment of the present invention, example of which is illustrated in the accompanying drawings.

Silicon crystallized by a sequential lateral crystallization method laterally forms a large grain that grows into a size of micrometers. Thus, if the sequential lateral crystallized silicon layer is used for a thin film transistor or the like, a channel layer with a single crystal grain can be realized. To optimize the crystallization method of the present invention, when performing sequential lateral solidification, the period of crystallizing the entire silicon layer is reduced by increasing the size of the crystal grown using one laser shot. For this purpose, a laser beam used for the present invention has a ramp shaped profile.

A laser used for sequential lateral solidification completely melts an amorphous silicon layer which the laser irradiates. When performing crystallization using a laser with an energy density in a complete melting region, the higher the laser intensity the larger the size of laterally growing grains.

The present invention is characterized in that sequential lateral solidification is asymmetrically performed by using a laser beam having a ramp shaped cross sectional profile on an amorphous silicon layer utilizing the above phenomenon. That is, one side has a strong laser density than the other side because the laser beam has a ramp shaped profile, and the silicon layer on which a strong laser is irradiated is crystallized for a relatively long time and thus the grains become longer.

The time taken for the entire crystallization can be reduced by repeating crystallization by using the longer grains as unit grains.

Figure 1:
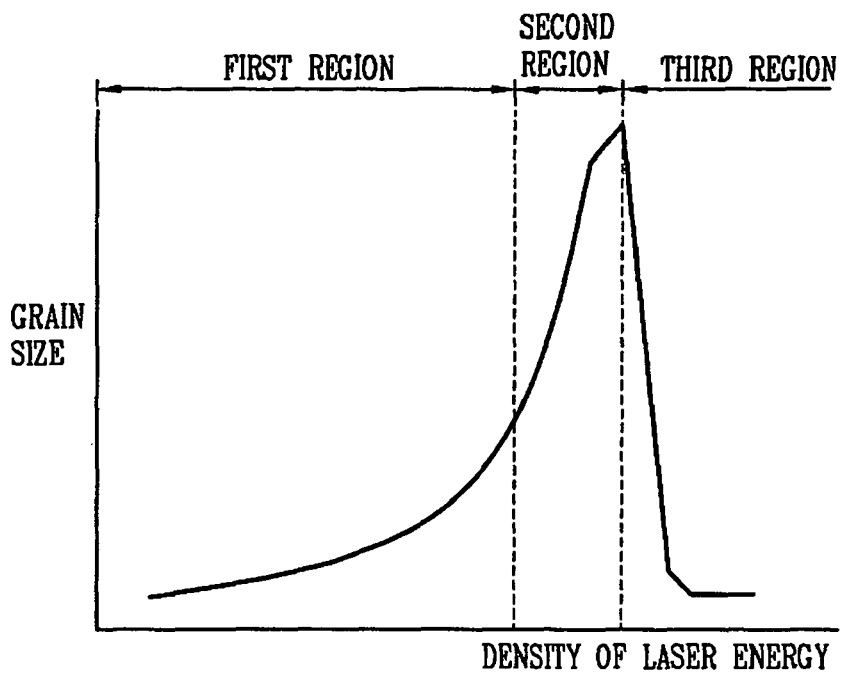
FIG. 1 is a graph showing the relation between density of laser energy and the size of crystal growth particles according to the related art.
Figure 2:
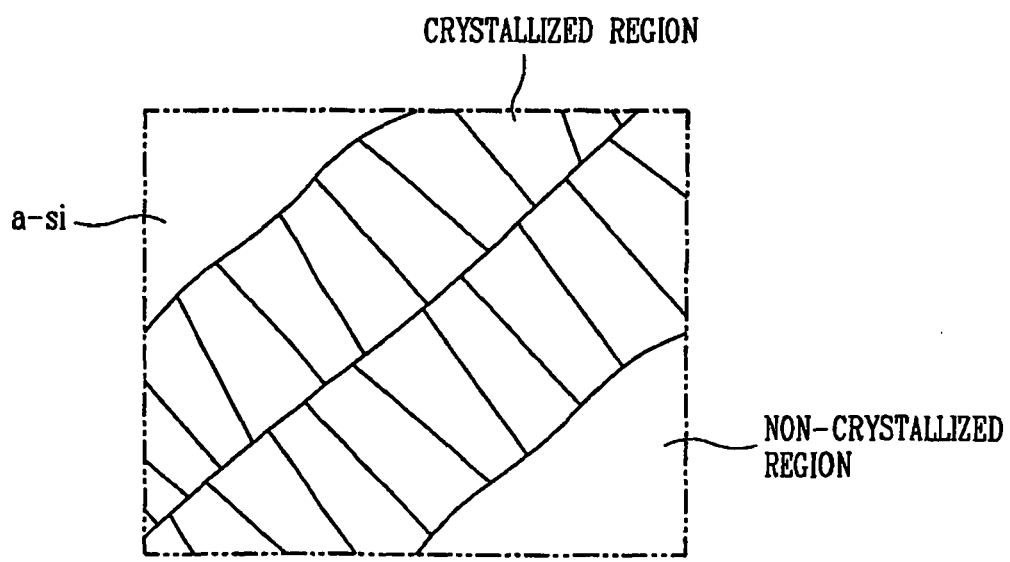
FIG. 2 is a plan view of silicon crystallized by a sequential lateral solidification according to the related art.
Figure 3:
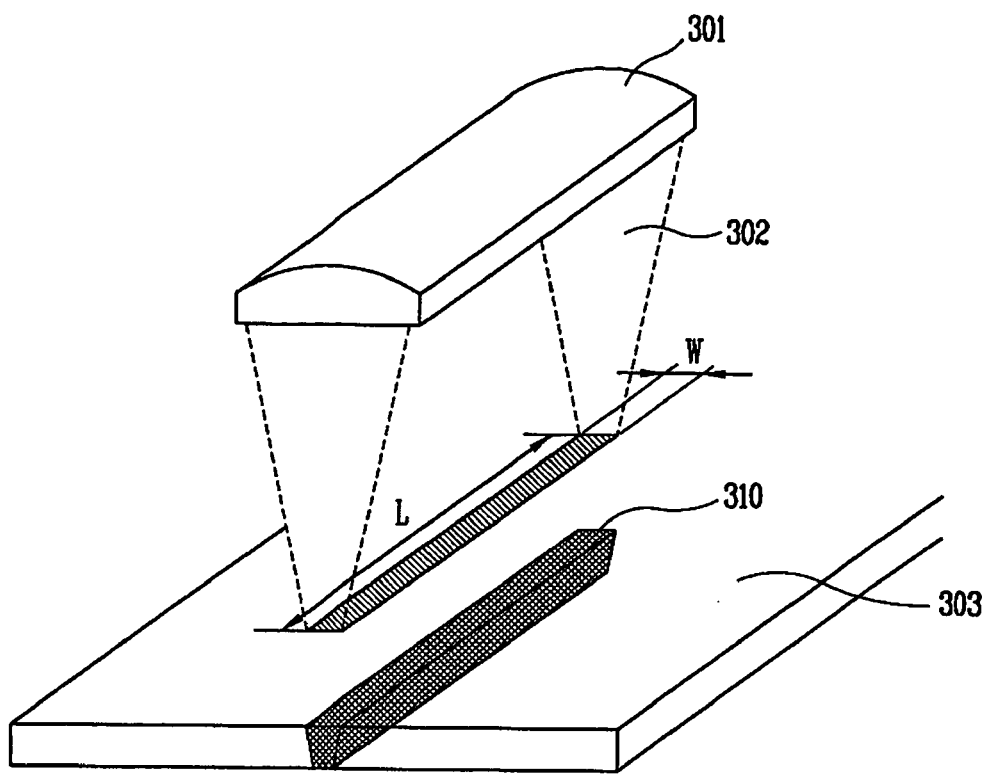
FIG. 3 is a diagram showing the irradiation pattern of a laser beam on a substrate according to the related art.
Figure 4:
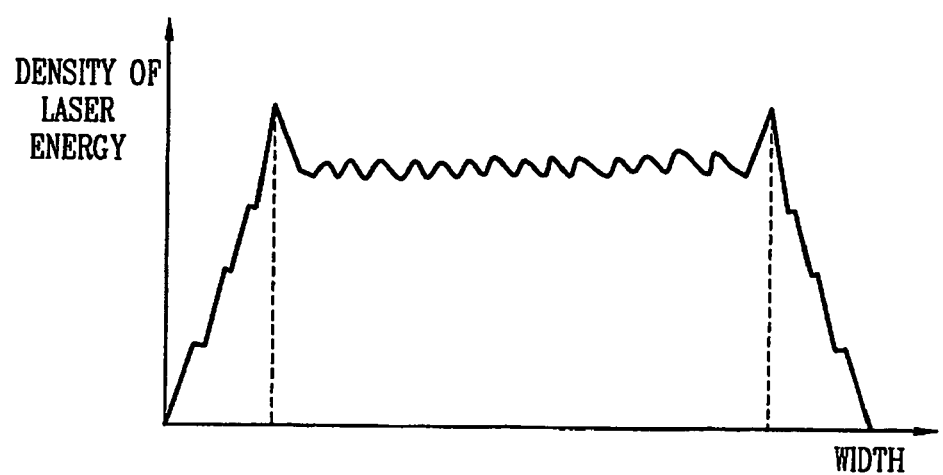
FIG. 4 is a cross sectional profile of a laser beam according to the related art.
Figure 5:
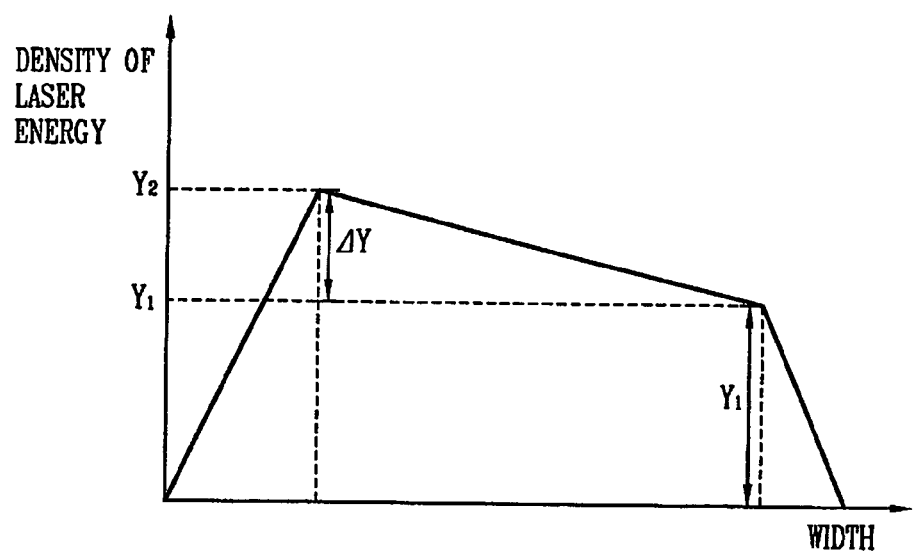
FIG. 5 is a cross sectional profile of a laser beam according to the present invention.
Figure 6:
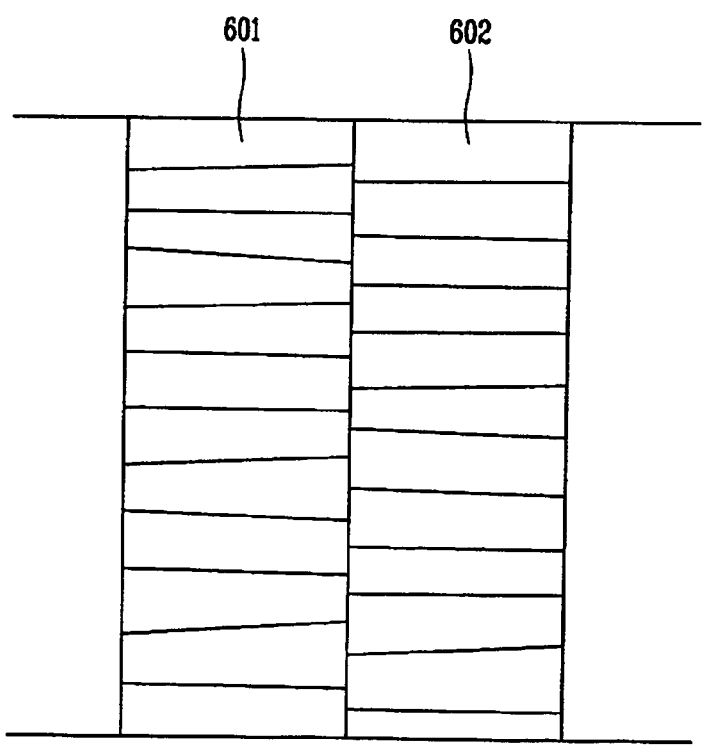
FIG. 6 is a plane view of silicon sequentially laterally solidified by the laser beam according to the present invention.

Referring to FIGS. 5 and 6, a sequential lateral solidification method according to the present invention will be described.

FIG. 5 shows a cross section of a laser beam having an asymmetrical width profile used in the present invention.

The X-axis of FIG. 5 corresponds to the width direction of a linear laser beam used for the present invention, and a Y-axis thereof represents the energy density of the laser beam.

As shown in FIG. 5, the laser beam has a ramp shaped profile.

The ramp gradually descends in the scanning direction in which the laser beam moves. The minimum intensity Y1 of the laser beam exists in a complete melting region. Thus, the laser beam intensity is in the complete melting region throughout the entire region. The maximum intensity Y2 of the laser beam is less than the intensity for evaporating the silicon layer, because if the laser intensity is higher than the degree to melt the silicon layer, the silicon layer is evaporated, thereby failing in crystallization.

When the ramp shaped laser beam irradiates the silicon layer using a mask with an opening as a filter, as shown in FIG. 6, crystalline silicon that asymmetrically laterally grows can be obtained.

The crystalline silicon can be divided into a first sequential lateral crystalline region 601 and a second sequential lateral crystalline region 602 having a smaller grain size than the first sequential lateral crystalline region 601.

The first lateral crystalline region 601 is a region irradiated with the greater intensity portion of the laser beam, and the second lateral crystalline region 602 is a region irradiated with the lesser intensity portion of the laser beam. That is, the first lateral crystalline region 601 irradiated with a stronger laser beam has a larger grain size than the second lateral crystalline region 602 irradiated with a weaker laser beam.

Sequential lateral solidification is a crystallization method in which crystal grows in the silicon starting at the lateral sides which are not melted because they are not irradiated with a laser to thus form one grain boundary in the center.

Consequently, when laser energy with a strong intensity irradiates the amorphous silicon, the time for crystallization is lengthened to thus obtain a relatively large crystal.

Afterwards, a secondary crystallization is performed by moving the substrate or the laser by a length slightly smaller than that of the first lateral crystalline region. The crystal continues to grow laterally subsequent to the first lateral crystalline region, thereby resulting in a large grain. That is, additional laser beam irradiation is performed by moving the laser beam by steps so that some parts overlap with the previous crystallized area.

In the present invention, because the laser beam has a ramp shaped cross sectional profile, the size of silicon crystallized by a single laser irradiation is relatively large, thereby reducing the time taken for crystallizing the entire substrate.

Referring to FIG. 7, the crystallization process of the present invention will be described in more detail.

FIG. 7 shows a laser beam 701 having a ramp shaped cross sectional profile, a mask 702 for filtering where the laser beam is irradiated onto the substrate, and a region 703 crystallized by a laser beam.

The laser beam is formed by a laser generator. As the laser generator moves in a scanning direction, or the substrate moves in the direction opposite to the scanning direction with the laser generator fixed, the amorphous silicon on the substrate may be crystallized. In this embodiment, it is assumed that the laser generator moves in the scanning direction for the purpose of this explanation.

First, as shown in FIG. 7, a laser beam generator is positioned so that the ramp shaped portion of a laser beam gradually descends in the scanning direction, and a laser beam is irradiated on a substrate (not shown) through the mask 702 formed at an outer side of a projection lens of the laser generator.

A first lateral crystallization region 703a and a second lateral crystallization region 703b are formed by a first laser pulse. As a result, lateral crystallization occurs in a direction towards the center by using the amorphous silicon at the sides as seeds for crystal growth, and a grain boundary is formed to the right of center of the first laser pulse, thereby accomplishing sequential lateral solidification. Hence, the first lateral crystallization region 703a is relatively larger than the second lateral crystallization region 703b. This is because the areas of the substrate are irradiated with different energy densities by the ramp shaped laser beam.

Next, a second laser pulse is irradiated after moving the laser generator a predetermined length less than the length W of the first lateral crystallization region.

As a result, some parts (region S of FIG. 7c) of the first lateral crystallization region 703a are overlapped, thereby accomplishing crystallization again. At this time, crystallization is performed subsequent to the first lateral crystallization region as the first lateral crystallization region 703a acts as seeds, thereby forming a bigger grain.

A nearly single lateral crystal with grains growing only in one direction can be obtained by performing lateral crystallization by repeating the laser pulse as set forth.

Because the lateral crystal formed by a laser beam having a ramp shaped profile is relatively large, i.e., the time taken to crystallize the entire substrate may be reduced, thereby improving the productivity.

Referring to FIG. 8, the degree of improving a crystallization speed by the crystallization method of the present invention will be described.

Figure 8A:
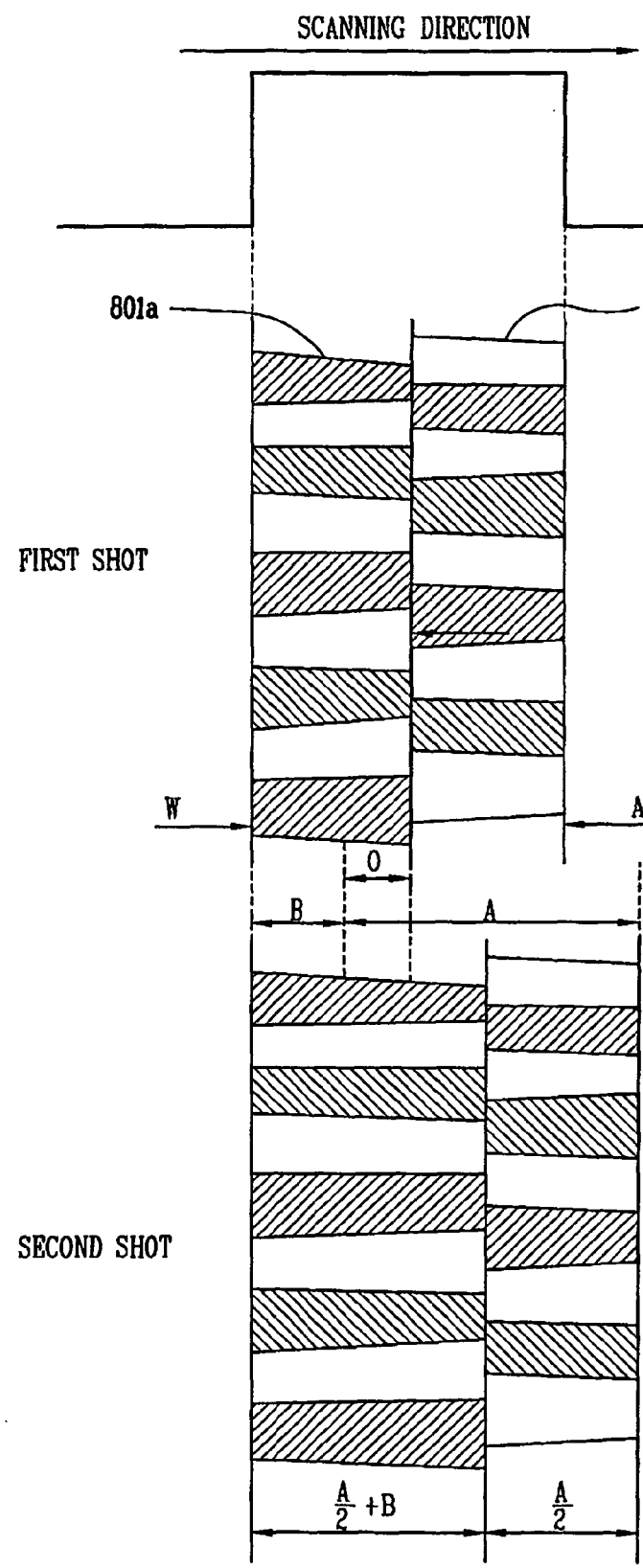
FIG. 8 is a pattern diagram showing a crystallization method for comparing the productivity of a conventional method and the productivity of the crystallization method of the present invention.

FIG. 8a shows a crystallization method using a laser having a conventional uniform cross sectional profile (hereinafter, referred to as a uniform profile).

Referring to FIG. 8a, when a first laser pulse is irradiated by using a laser beam having a uniform profile, a first lateral crystallization region 801a and a second lateral crystallization region 801b having the same size are formed. If the total length crystallized by the first shot is referred to as A, the length of the first and second lateral crystallization regions is A/2.

Next, a second laser pulse is irradiated by overlapping a predetermined region (O of FIG. 8a). As a result, crystallization is further performed subsequent to the first lateral crystallization region 801a, thereby obtaining lateral crystalline having a size of A/2+B (B is a length obtained by subtracting the length of the region overlapped by the second shot from the crystallization length formed by the first shot. Crystalline silicon having a total length of L can be obtained by repeating the above method.

At this time, the length of the region B is A/2*f. f is a ratio of the length remaining without being overlapped by the second pulse to the crystallization length A/2 crystallized by the first pulse (0<f<1). That is, B=A/2*f.

When the crystallization is repeated with respect to the total length L, a total number of shots equals to a value obtained by dividing the total length by B.

That is, the total number of pulses=L/B=L/(A/2*f)

Figure 8B:
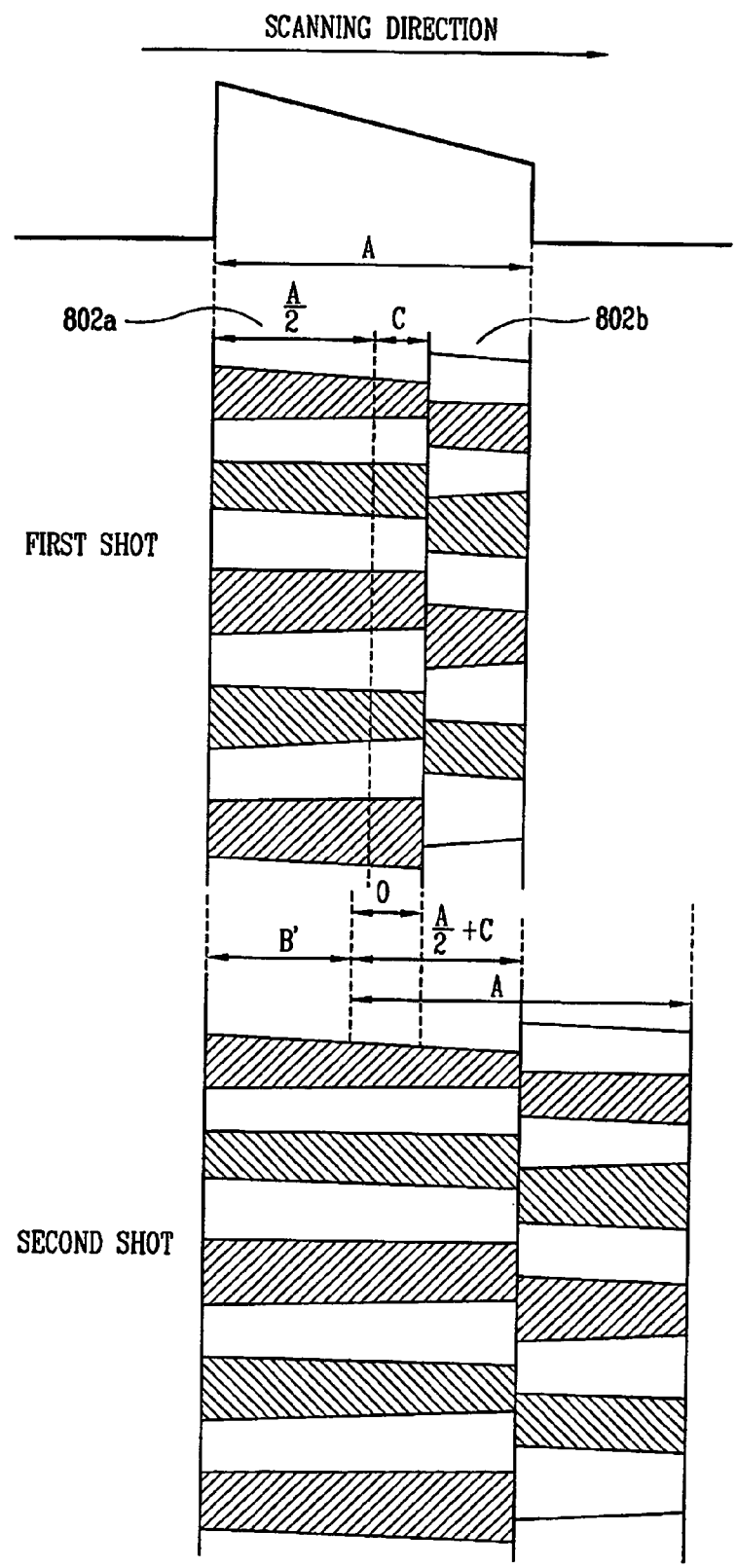

On the contrary, referring to FIG. 8b, in the crystallization method of the present invention in which crystallization is performed by a laser beam having a ramp shaped cross sectional profile, a relatively longer first lateral crystallization region 802a and second lateral crystallization region 802b are formed by a first laser pulse.

The length of the first lateral crystallization region is A/2+C. Here, A is a total length crystallized by the first laser shot, and C is a length of the lateral crystallization region of the present invention which becomes longer by the crystallization method of the present invention.

Next, some portion (O of FIG. 8b) of the first lateral crystallization region is overlapped, and a second laser pulse is generated.

As a result, the crystal further grows subsequent to the first lateral crystallization region 802a, thereby forming a lateral crystallization region having a length of B'+(A/2+C).

At this time, B' is a value obtained by subtracting the length overlapped with the second pulse from the length crystallized by the first laser pulse, that is, (A/2+C)−O. In other words, (A/2+C)*f. Here, f is a ratio of the length of the first shot region not overlapped with the second shot to the length A/2+C crystallized by the first shot. f is in the range of 0<f<1.

Therefore, if the above process is performed with respect to the total length L, the number of laser pulses becomes a value obtained by dividing the length L by B'. That is, the number of laser pulses irradiated to crystallize a silicon layer of length L equals L/B'=L/((A/2+C)*f).

Consequently, in the crystallization method of the present invention, the number of pulses is decreased as much as L/B−L/B' as compared to the conventional crystallization method.

The decrease in the number of pulses is represented by the following percentage:

$$\frac{L/B - L/B'}{L/B} * 100 = \frac{\frac{L}{\frac{A}{2}*f} - \frac{L}{\left(\frac{A}{2}+C\right)*f}}{\frac{L}{\frac{A}{2}*f}} * 100 = \frac{2C}{A+2C} * 100$$

Besides, the percentage of pulse decrease by the above expression is as follows.

| A(μm) | C(μm) | % increase rate |
|---|---|---|
| 4 | 1.0 | 20.0 |
| 4 | 1.5 | 42.9 |
| 6 | 0.5 | 14.3 |
| 6 | 1.0 | 25.0 |
| 6 | 1.5 | 33.3 |
| 6 | 2.0 | 40.0 |
| 6 | 2.5 | 45.5 |
| 8 | 1.5 | 27.3 |
| 8 | 2.0 | 33.3 |
| 8 | 2.5 | 38.5 |
| 8 | 3.0 | 42.9 |
| 8 | 3.5 | 46.7 |
| 10 | 1.5 | 23.1 |
| 10 | 2.0 | 28.6 |
| 10 | 2.5 | 33.3 |
| 10 | 3.0 | 37.5 |
| 10 | 3.5 | 41.2 |
| 10 | 4.0 | 44.4 |
| 10 | 4.5 | 47.4 |

Therefore, a decrease in crystallization time of up to nearly 50% results according to the length C of crystallization increasing by the first laser pulse.

Hereinafter, a method of fabricating a thin film transistor using the crystallization method of the present invention will be described briefly. A buffer layer is formed on a substrate, and then an amorphous silicon layer is formed thereon. Next, a polysilicon thin film transistor can be formed including the steps of: crystallizing the amorphous silicon using the crystallization method of this invention; forming an active layer by patterning the crystallized silicon layer; forming a gate insulating layer on the active layer by a plasma chemical vapor deposition method or the like; forming a gate electrode on the gate insulating layer; forming source and drain regions by implanting impurity ions into the active layer by using the gate electrode as a mask; forming an interlayer insulating layer on the active layer; forming source and drain electrodes by coating a conductive layer on the interlayer insulating layer and patterning the same; forming a passivation layer on the source and drain electrodes; and forming a pixel electrode connected to the drain electrode on the passivation layer.

The above crystallization method may be applied to the configuration of a driving element such as a CMOS, as well as the fabrication of a thin film transistor.

Subsequently, the present invention may improve productivity by reducing the time for crystallizing the entire silicon layer by a sequential lateral solidification without adding any new process to the conventional crystallization method. Besides, a driving element capable of fast operation may be formed because silicon subject to sequential lateral solidification is used.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A crystallization method, comprising:
   forming an amorphous silicon layer on a substrate;
   performing a first crystallization process by irradiating the amorphous silicon layer with a first laser beam having an asymmetrical upper cross sectional energy density profile of a ramp shape that descends in a scanning direction to form a first lateral crystallization region, wherein the asymmetrical upper cross sectional energy density profile is not flat, and wherein the first crystallization process is performed by a sequential lateral crystallization method; and
   performing a second crystallization process with the laser beam by moving a second laser beam to a predetermined length in a scanning direction so as to be partially overlapped with the first lateral crystallization region formed by the first crystallization process, wherein the second crystallization process is performed by irradiating the amorphous silicon layer with the laser beam having an asymmetrical upper cross sectional energy density profile of a ramp shape that descends in a scanning direction to form a second lateral crystallization region, and wherein the second crystallization process is performed by a sequential lateral crystallization method, wherein the second crystallization process overlaps with the first lateral crystallization region, and the first lateral crystallization region irradiated with the first laser beam has a larger grain size than the second lateral crystallization region irradiated with the second laser beam having a lower peak than that of the first laser beam, and a crystallization region comprises the first and second crystallization regions,
   wherein the first lateral crystallization region and the second lateral crystallization region are formed by a first laser pulse so the lateral crystallization occurs in a direction towards the center by using the amorphous silicon at the sides as seeds for crystal growth, and a grain boundary is formed to the right of center of the first laser pulse, to accomplish sequential lateral solidification, and wherein the first lateral crystallization region is relatively larger than the second lateral crystallization region; and a second laser pulse is irradiated after moving a laser generator to a predetermined length less than a length of the first lateral crystallization region so that some parts of the first lateral crystallization region are overlapped, to accomplish crystallization again, wherein the crystallization is performed subsequent to the first lateral crystallization region as the first lateral crystallization region acts as seeds, to form a bigger grain.

2. The method of claim 1, wherein the first laser beam has an energy density to completely melt the amorphous silicon layer.

3. The method of claim 1, wherein the first and second crystallization regions formed by irradiating the first and second laser beams are asymmetrical.

4. A method of fabricating a liquid crystal display device, comprising:
forming an amorphous silicon layer on a substrate;
a first crystallization step of forming an asymmetrical crystallization region by irradiating the amorphous silicon layer with a first laser beam having an asymmetric upper cross sectional energy density profile of a ramp shape that descends in a scanning direction, wherein the asymmetrical upper cross sectional energy density profile is not flat; and
a second crystallization step of irradiating the laser beam by moving a second laser beam in the scanning direction so as to overlap a portion of the crystallization region, wherein the second crystallization step is performed by irradiating the amorphous silicon layer with the second laser beam having an asymmetric upper cross sectional energy density profile of a ramp shape that descends in a scanning direction, and wherein the laser beam having a ramp shaped cross sectional profile is provided with a first region having a maximum energy peak and a second region having a minimum energy peak, and the first region corresponds to a first lateral crystallization region and the second region corresponds to a second lateral crystallization region,
wherein the second crystallization step is performed by moving the second laser beam by steps so that some parts of the second laser beam overlap with the first region, and wherein the second crystallization process overlaps with the first region, and the first region irradiated with the first laser beam has a larger grain size than the second region irradiated with the second laser beam having a lower peak than that of the first laser beam, and a crystallization region comprises the first and second regions,
wherein the first lateral crystallization region and the second lateral crystallization region are formed by a first laser pulse so that lateral crystallization occurs in a direction towards the center by using the amorphous silicon at the sides as seeds for crystal growth, and a grain boundary is formed to the right of center of the first laser pulse, to accomplish sequential lateral solidification, and wherein the first lateral crystallization region is relatively larger than the second lateral crystallization region; and
a second laser pulse is irradiated after moving a laser generator to a predetermined length less than a length of the first lateral crystallization region so that some parts of the first lateral crystallization region are overlapped, to accomplish crystallization again, wherein the crystallization is performed subsequent to the first lateral crystallization region as the first lateral crystallization region acts as seeds, to form a bigger grain; and crystallizing the entire amorphous silicon layer by repeating the first crystallization step and the second crystallization step.

5. The method of claim 4, wherein the asymmetrical crystallization region consists of the first lateral crystallization region and of the second lateral crystallization region shorter than the first lateral crystallization region.

6. The method of claim 4, further comprising:
forming an active layer by patterning the crystallized silicon layer;
forming a gate insulating layer on the active layer;
forming a gate electrode on the gate insulating layer;
forming source and drain electrodes connected to the active layer; and
forming a pixel electrode connected to the drain electrode.

7. A method of fabricating a liquid crystal display device, comprising:
forming an amorphous silicon layer on a substrate;
a first crystallization step of irradiating the amorphous silicon layer with a first laser beam having an asymmetric upper cross sectional energy density profile of a ramp shape that descends in a scanning direction to a first asymmetrical lateral crystallization region, wherein the asymmetrical upper cross sectional energy density profile is not flat; and
a second crystallization step of irradiating a second laser beam by moving the first laser beam in the scanning direction so as to overlap a portion of the first asymmetrical lateral crystallization region to form a second asymmetrical lateral crystallization region, wherein the second crystallization step is performed by irradiating the amorphous silicon layer with the second laser beam having an asymmetric upper cross sectional energy density profile of a ramp shape that descends in a scanning direction, wherein the first laser beam having a ramp shaped cross sectional profile is provided with a first region having a maximum energy peak and a second region having a minimum energy peak, and the first region corresponds to the first asymmetrical lateral crystallization region and the second region corresponds to the second asymmetrical lateral crystallization region, and the second crystallization step is performed by moving the second laser beam by steps so that some parts of the laser beam overlap with the first region,
wherein the first asymmetrical lateral crystallization region and the second asymmetrical lateral crystallization region are formed by a first laser pulse so the lateral crystallization occurs in a direction towards the center by using the amorphous silicon at the sides as seeds for crystal growth, and a grain boundary is formed to the right of center of the first laser pulse, to accomplish sequential lateral solidification, and wherein the first asymmetrical lateral crystallization region is relatively larger than the second asymmetrical lateral crystallization region; and
a second laser pulse is irradiated after moving a laser generator to a predetermined length less than a length of the first asymmetrical lateral crystallization region so that some parts of the first asymmetrical lateral crystallization region are overlapped, to accomplish crystallization again, wherein the crystallization is performed subsequent to the first asymmetrical lateral crystallization region as the first asymmetrical lateral crystallization region acts as seeds, to form a bigger grain;

crystallizing the entire amorphous silicon layer by repeating the first crystallization step and the second crystallization step;

forming an active layer by patterning the crystallized silicon layer;

forming a gate insulating layer on the active layer;

forming a gate electrode on the gate insulating layer;

forming source and drain electrodes connected to the active layer; and forming a pixel electrode connected to the drain electrode.

8. The method of claim 7, wherein a crystallization region consists of a first asymmetrical lateral crystallization region and a second asymmetrical lateral crystallization region shorter than the first asymmetrical lateral crystallization region.

* * * * *